(12) United States Patent
Hilla et al.

(10) Patent No.: US 6,226,771 B1
(45) Date of Patent: May 1, 2001

(54) METHOD AND APPARATUS FOR GENERATING ERROR DETECTION DATA FOR ENCAPSULATED FRAMES

(75) Inventors: Stephen C. Hilla, Raleigh; James M. Edwards, Cary; Timothy F. Masterson, Raleigh; William E. Jennings, Cary, all of NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 09/211,682

(22) Filed: Dec. 14, 1998

(51) Int. Cl.[7] .................................................. A03M 13/00
(52) U.S. Cl. .......................................... 714/758; 714/776
(58) Field of Search ................................ 714/758, 757, 714/776, 781, 784, 807, 752, 52

(56) References Cited

U.S. PATENT DOCUMENTS

| Re. 33,900 | 4/1992 | Howson | 370/105 |
|---|---|---|---|
| 5,072,449 | 12/1991 | Enns et al. | 371/37.1 |
| 5,128,945 | 7/1992 | Enns et al. | 371/37.1 |
| 5,285,456 | * 2/1994 | Cheney et al. | 714/800 |
| 5,742,604 | 4/1998 | Edsall et al. | 370/401 |
| 5,935,268 | * 8/1999 | Weaver | 714/758 |
| 6,098,188 | * 8/2000 | Kalmanck, Jr. et al. | 714/746 |

OTHER PUBLICATIONS

IEEE P802.1D/D15 *Media Access Control (MAC) Bridge: Revision*, (Nov. 24, 1997), pp. 1–19, 25–28, 55–56, 320–325 and 353–360.
*Ethernet–110 Core: Technical Manual*, (Apr. 1996), pp. 1–13 to 1–14 and 3–1 to 3–22.
R. Breyer and S. Riley, *Switched and Fast Ethernet*, (2nd ed. © 1996), pp. vii–xvi and 68–79.

* cited by examiner

Primary Examiner—Christine T. Tu
(74) Attorney, Agent, or Firm—Cesari and McKenna, LLP

(57) ABSTRACT

An error detection generator calculates error detection data for insertion into encapsulated frames. The error detection generator is configured to calculate multiple error detection values and insert them into corresponding fields of the encapsulated frames. The error detection generator includes a controller, three cyclic redundancy check (CRC) engines and at least one multiplexer. Each CRC engine is selectively enabled by the controller to calculate a frame check sequence (FCS) value on a different portion of the frame. Downstream CRC engines also receive the outputs from the upstream CRC engines so that these earlier FCS values may be used during subsequent calculations. The outputs of the CRC engines are also inserted into the appropriate fields of the encapsulated frames by the multiplexer.

15 Claims, 8 Drawing Sheets

US 6,226,771 B1

METHOD AND APPARATUS FOR GENERATING ERROR DETECTION DATA FOR ENCAPSULATED FRAMES

FIELD OF THE INVENTION

The present invention relates generally to computer networks, and more specifically, to a method and apparatus for generating error detection information for insertion into encapsulated frames.

BACKGROUND OF THE INVENTION

A computer network typically comprises a plurality of interconnected entities that transmit (i.e., "source") or receive (i.e., "sink") messages, such as frames or packets. A common type of computer network is a local area network ("LAN") which typically refers to a privately owned network within a single building or campus. LANs employ a data communication protocol (LAN standard), such as Token Ring, Ethernet or Token Bus, that defines the functions performed by the data link and physical layers of a communications architecture (i.e., a protocol stack), such as the Open Systems Interconnection (OSI) Reference Model from the International Standards Organization.

To form a wide area network ("WAN"), metropolitan area network ("MAN") or intranet, one or more intermediate devices are often used to couple multiple LANs together. For example, a bridge may be used to provide a "bridging" function between two or more LANs. Alternatively, a switch may be utilized to provide a "switching" function for transferring information, such as data frames, between LANs. Typically, the switch is a computer having a plurality of ports that couple the switch to several LANs and to other switches. The switching function includes receiving data frames at a source port and transferring them to at least one destination port.

Virtual Local Area Networks

A computer network may also be segregated into a series of network groups. For example, U.S. Pat. No. 5,394,402, to Ross (the "'402 Patent") discloses an arrangement that is capable of associating any port of a switch with any particular segregated network group. Specifically, according to the '402 Patent, any number of physical ports of a particular switch may be associated with any number of groups within the switch by using a virtual local area network (VLAN) arrangement that virtually associates the port with a particular VLAN designation. More specifically, Ross discloses a system that associates VLAN designations with at least one internal switch port and further associates those VLAN designations with messages transmitted from any of the ports to which the VLAN designation has been assigned. Thus, those entities having the same VLAN designation function as if they are all part of the same LAN.

The VLAN designation for each internal port is stored in a memory portion of the switch such that every time a message is received by the switch on an internal port the VLAN designation of that port is associated with the message. Association is accomplished by a flow processing element which looks up the VLAN designation in a memory based on the internal port where the message originated. Message exchanges between parts of the network having different VLAN designations are specifically prevented in order to preserve the boundaries of each VLAN segment. In addition to the '402 patent, the Institute of Electrical and Electronics Engineers (IEEE) is preparing a standard for Virtual Bridged Local Area Networks. See IEEE Standard 802.1q (draft).

Error Detection

To deal with errors caused during transmission of frames, most LAN standards include some form of error detection. Error detection allows the receiver to deduce that an error exists in a received frame. In response, the receiver may request retransmission of the frame. The IEEE Token Ring (802.5) and Ethernet (802.3) standards, for example, specify a 32 bit error detection algorithm known as the cyclic redundancy check (CRC) algorithm, which provides up to $10^{10}$ bits of error detection. In particular, a k-bit data frame is processed to generate an n-bit Frame Check Sequence (FCS) that is appended to the frame such that the resulting frame, consisting of k+n bits, is exactly divisible by some number. A receiving entity divides the frame by the agreed-upon number and determines whether a remainder exists. If so, the receiving entity concludes that an error exists and requests retransmission of the frame.

When an Ethernet or Token Ring frame is received at a switch, the FCS value is typically stripped off and used to check whether an error exists with the frame. If an error is found, the frame is discarded. Since most source entities retransmit frames that are not acknowledged, the discarded frame will be retransmitted by the source entity. If no error is detected, the fame is switched onto the corresponding destination port for forwarding to the intended recipient. Before the frame is forwarded, however, the switch generates a new FCS value which is appended to the frame. By checking received frames, switches avoid transporting defective frames, thereby conserving network resources.

Fast Ethernet

The original Ethernet standard, referred to as 10 Base-T, is capable of transmitting data at 10 Mbs. In 1995, the IEEE approved a Fast Ethernet standard, referred to as 100 Base-T, which is capable of operating at 100 Mbs. Fast Ethernet is typically used on links or tis between two or more switches to improve network performance. Frames received at a first switch and destined to entities coupled to a neighboring switch are transported across such high speed links. Such messages, however, may be associated with more than one VLAN designation. To preserve VLAN associations of messages transported across trunks or links, both Ross and the 802.1 q standard disclose appending a VLAN identifier field to the corresponding frames.

In addition, U.S. Pat. No. 5,742,604 to Edsall et al. (the "'604 patent"), is which is commonly owned with the present application, discloses an Interswitch Link (ISL) encapsulation mechanism for efficiently transporting packets or frames, including VLAN-modified frames, between switches while maintaining the VLAN association of the frames. In particular, an ISL link, which may utilize the Fast Ethernet standard, connects ISL interface circuitry disposed at each switch. The transmitting ISL circuitry encapsulates the frame being transported within an ISL header and ISL error detection information, while the ISL receiving circuitry strips off this information and recovers the original frame.

FIG. 1 is a block diagram of an ISL encapsulated frame 100. The encapsulated frame 100 includes an original frame, such as Ethernet frame 102, that is encapsulated within an ISL header 104 and an ISL FCS field 106. The Ethernet frame 102 includes a plurality of well-known fields, such as a Medium Access Control (MAC) destination address (DA) 108, a MAC source address (SA) 110, a data field 112 and an Ethernet FCS field 114, among others. The ISL header 104 also includes a plurality of fields. In particular, the ISL header 104 includes an ISL DA field 116, a frame type field 118, an ISL SA field 120, a length (LEN) field 122 and a VLAN identifier (ID) field 124.

The ISL DA field 116 identifies the ISL interface circuitry of the receiving switch and may be a multicast or unicast address. The frame type field 118 indicates the type of original frame that is encapsulated. For example, although the ISL encapsulated frame 100 is shown encapsulating an Ethernet frame 102, other frame types, such as Token Ring, Fiber Distributed Data Interface (FDDI) or Asynchronous Transfer Mode (ATM), may be encapsulated within ISL header 104 and ISL FCS 106. The ISL SA field 120 may identify the ISL interface circuitry forwarding the frame 100 and the length field 112 indicates the length of frame 100. The VLAN ID field 124 carries the VLAN designation associated with the original frame 102 being encapsulated. To the extent the original frame 102 includes its own VLAN ID field, such as a Tag Protocol Identifier Field (TPID) field as specified in the 802.1 q draft stanard, this designation may be repeated in field 124.

As shown, the ISL encapsulated frame 100 includes two FCS fields: an Ethernet FCS field 114 and an ISL FCS field 106. These FCS fields must be loaded with error detection values by the transmitting switch prior to forwarding the frame 100 over the ISL link. To perform these calculations, the corresponding ISL circuitry includes two CRC generators. The first CRC generator calculates the FCS for the Ethernet frame (i.e., fields 108–112), while the second CRC generator calculates the ISL CRC based on the entire frame (i.e., fields 108–124).

The ISL mechanism has been extended to support switched Token Ring networks. That is, the ISL circuitry has been enhanced to support the encapsulation of Token Ring frames between an ISL header and an ISL FCS field. For Token Ring encapsulation, the ISL header includes two components: a primary ISL header that is similar to the ISL header 104 described above and a Token Ring ISL (TR-ISL) header that includes additional fields related to the encapsulated token ring frame. Furthermore, unlike Ethernet frames which end with an FCS field, token ring frames conclude with an ending delimiter field and a frame status field which are not covered by the FCS error detection field. Given the additional TR-ISL header and these two unchecked token ring fields, ISL encapsulated token ring frames typically include an intermediary FCS field, raising the total number of FCS fields to three. However, the CRC engine described above is configured to generate only two FCS fields. Accordingly, a need has arisen for a mechanism that can efficiently generate all three FCS values needed to perform ISL encapsulation of Token Ring frames.

SUMMARY OF THE INVENTION

It is an object of the present invention to provide a method and apparatus for efficiently generating FCS values for encapsulated frames, including Token Ring frames.

It is a further object of the present invention to provide a method and apparatus for selectively generating two or three FCS values depending on the type of frame being encapsulated.

It is a further object of the present invention to provide a mechanism for rapidly generating the requisite FCS values for encapsulated frames.

Briefly, the invention relates to a method and apparatus for rapidly and efficiently generating error detection values for insertion in encapsulated frames transported between network switches. The network switches are preferably interconnected by an interswitch link (ISL) mechanism that maintains the Virtual Local Area Network (VLAN) association of the frames by encapsulating them in a one or two level ISL header prior to transmission. The apparatus includes an error detection generator that calculates multiple error detection values and inserts them into corresponding fields of the ISL encapsulated frames. The error detection generator preferably includes a controller, three cyclic redundancy check (CRC) engines and at least one multiplexer. Each CRC engine receives the encapsulated frames being processed and calculates a frame check sequence (FCS) value on a different portion of the frame. That is, the controller selectively enables and disables each CRC engine depending on the portion of the encapsulated frame currently being processed by the error detection generator. Additionally, downstream CRC engines receive the outputs from the upstream CRC engines so that the earlier FCS values may be used during subsequent calculations. The outputs of the CRC engines are also inserted into the appropriate fields of the encapsulated frames by the multiplexer. The encapsulated frames are then transmitted to the neighboring switch across the ISL link.

In the preferred embodiment, the three CRC engines are arranged in a "streamwise" manner such that the second CRC engine receives the output of the first CRC engine and the third CRC engine receives the outputs of both the first and second CRC engines. Each encapsulated frame, moreover, preferably includes a flag indicating the type of frame that is encapsulated. Depending on the flag setting, the controller enables either two or three of the CRC engines for generating the requisite FCS values. For example, for token ring encapsulated frames, three FCS values are generated and inserted. Preferably, the controller enables the first CRC engine to calculate an FCS value for the token ring frame, the second CRC engine to calculate an FCS value for the first level of ISL encapsulation (including the token ring frame and the first FCS value), and the third CRC engine to calculate an FCS value for the entire ISL-encapsulated frame. For Ethernet encapsulated frames, only one level of ISL encapsulation is used and, therefore, only two of the three CRC engines need be enabled. In particular, the controller enables the first CRC engine to calculate an FCS value for the Ethernet frame and the second CRC engine to calculate an FCS value for the entire ISL-encapsulated frame.

BRIEF DESCRIPTION OF THE DRAWINGS

The above and further advantages of the invention may be better understood by referring to the following description in conjunction with the accompanying drawings, in which.

DETAILED DESCRIPTION OF THE PREFERRED EMBODIMENT

Figure 2:
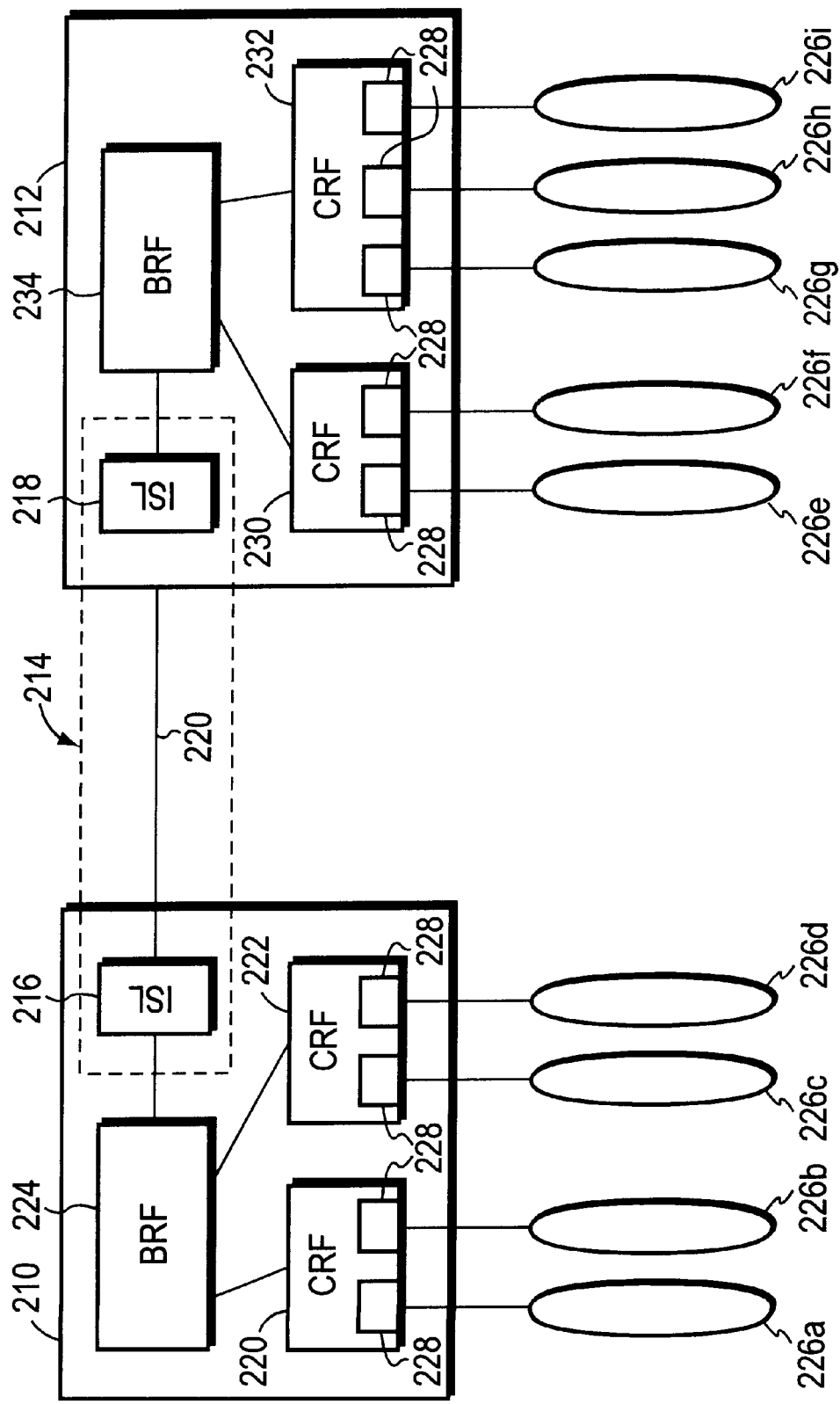
FIG. 2 is a block diagram of a plurality of network switches interconnected by an ISL mechanism.

FIG. 2 is a block diagram of a plurality of network switches 210 and 212 interconnected by an Interswitch Link (ISL) mechanism 214. The ISL mechanism 214 includes an ISL interface circuit 216, 218 disposed at each network switch 210, 212, respectively, and an ISL link 220 that connects the two ISL interface circuits 216, 218. A suitable ISL mechanism for use with the present invention is described in U.S. Pat. No. 5,742,604, which is hereby incorporated by reference in its entirety. Each network switch 210, 212, moreover, is preferably compatible with the Dedicated Token Ring (DTR) bridge standard promulgated by the Institute of Electrical and Electronics Engineers (IEEE) in Annex K to the IEEE 802.5 standard, which governs token ring LANs.

The DTR standard establishes a hierarchical bridging arrangement. Specifically, each bridge defines one or more Bridge Relay Functions (BRFs) and one or more Concentrator Relay Functions (CRFs) each of which performs a different bridging function. More specifically, each CRF interconnects a plurality of physical token ring segments into one logical token ring having a single ring number. The CRF forwards token ring frames from one token ring segment to another. The BRF supports bridging between different CRFs. That is, rather than or in addition to forwarding frames from one token ring segment to another, a first CRF may pass them up to its associated BRF. The BRF, in turn, may forward the frames to a second CRF that is also coupled to the BRF. The second CRF may then forward them onto one of its token ring segments. Thus, BRFs allow token ring frames to be transferred between different token ring numbers.

In particular, switch 210 includes several CRF entities 220, 222 that are coupled to an associated BRF entity 224. Each CRF 220, 222, moreover, is connected to multiple token ring segments 226a–d through respective switch ports 228. Nonetheless, all of the token ring segments connected to a single CRF, such as ring segments 226a–b, have a single token ring number (e.g., Token Ring 1). Similarly, switch 212 includes multiple CRF entities 230–232 that are coupled to a corresponding BRF entity 234. Each CRF 230–232 of switch 212, moreover, is coupled to multiple token ring segments 226e–i through respective switch ports 228.

The hierarchical arrangement of the DTR standard allows token ring networks to employ two different levels of Virtual Local Area Network (VLAN) designations. In particular, a first VLAN designation may be associated with each CRF entity and a second VLAN designation may be associated with the BRF entities. Thus, a token ring frame can originate from a first segment (e.g., segment 226a) and thereby be associated with the VLAN designation for its corresponding CRF entity (e.g., CRF 220) and yet be switched to a CRF having a different VLAN designation (e.g., CRF 222), provided that this second CRF is associated with the same BRF and thus shares the same BRF VLAN designation. To preserve the two-level VLAN association of token ring frames that are transported on ISL link 220, the corresponding ISL header used to encapsulate these frames preferably includes two VLAN ID fields.

Figure 3A:
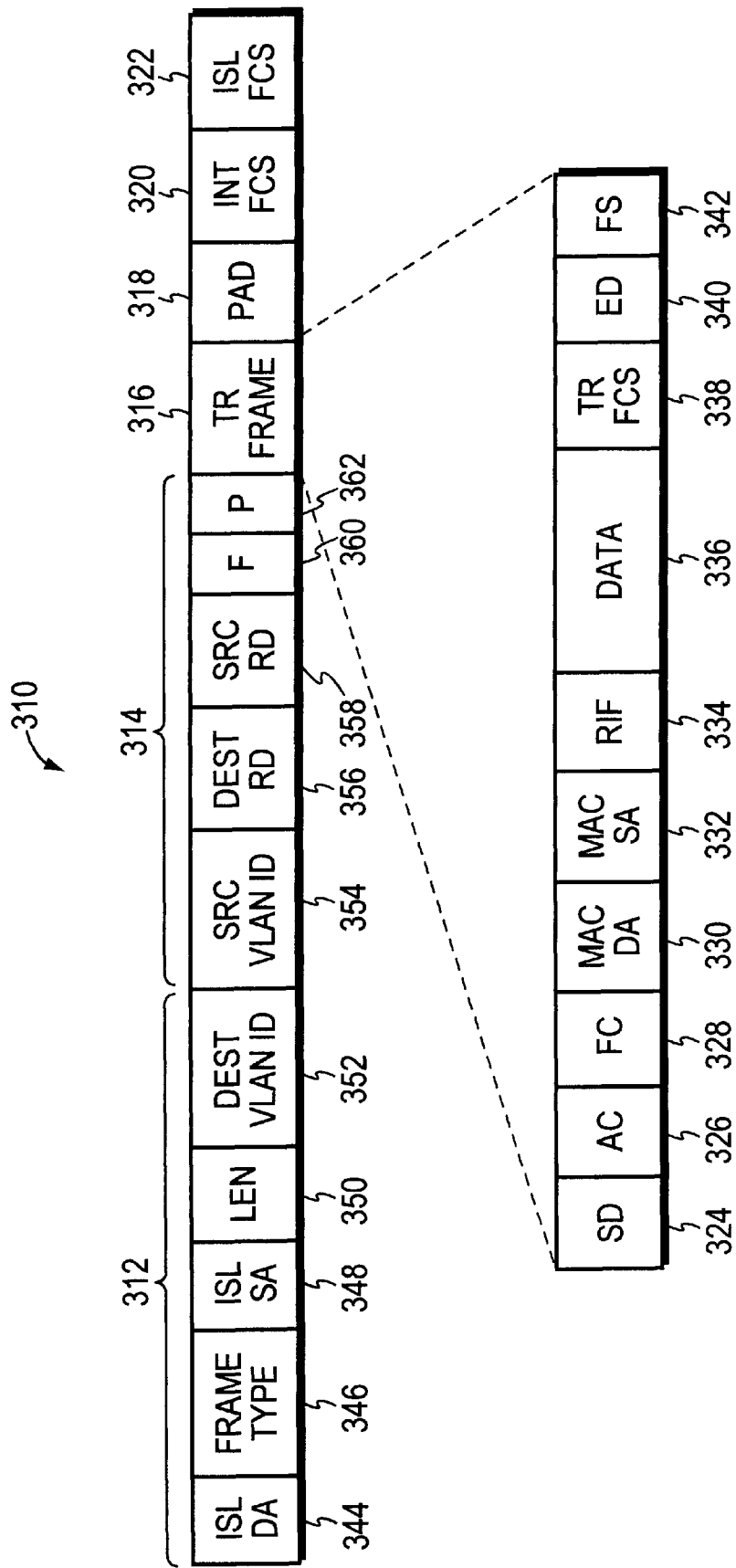
FIG. 3A is a block diagram of an ISL-encapsulated Token Ring frame.

FIG. 3A is a block diagram illustrating the format of a preferred ISL-encapsulated token ring frame 310. The ISL-encapsulated frame 310 includes a first ISL header 312 and a second ISL header 314 that encapsulate a standard token ring frame 316. The ISL-encapsulated frame 310 her includes a Pad field 318 and an intermediate (INT) FCS field 320 that both are associated with the second ISL header 314 and an ISL FCS field 322. The token ring frame 316 includes the following fields: a starting delimiter (SD) field 324, an access control (AC) field 326, a frame control (FC) field 328, a Medium Access Control (MAC) destination address (DA) field 330, a MAC source address (SA) field 332, a route information field (RIF) 334, a data field 336, a token ring frame check sequence (TR FCS) field 338, an ending delimiter (ED) field 340 and a frame status field 342. The size and contents of fields 324–342 are well-known to those skilled in the art and are described in A. Tanenbuam Computer Networks (3rd ed. 1996) at pages 296–298.

Figure 1:
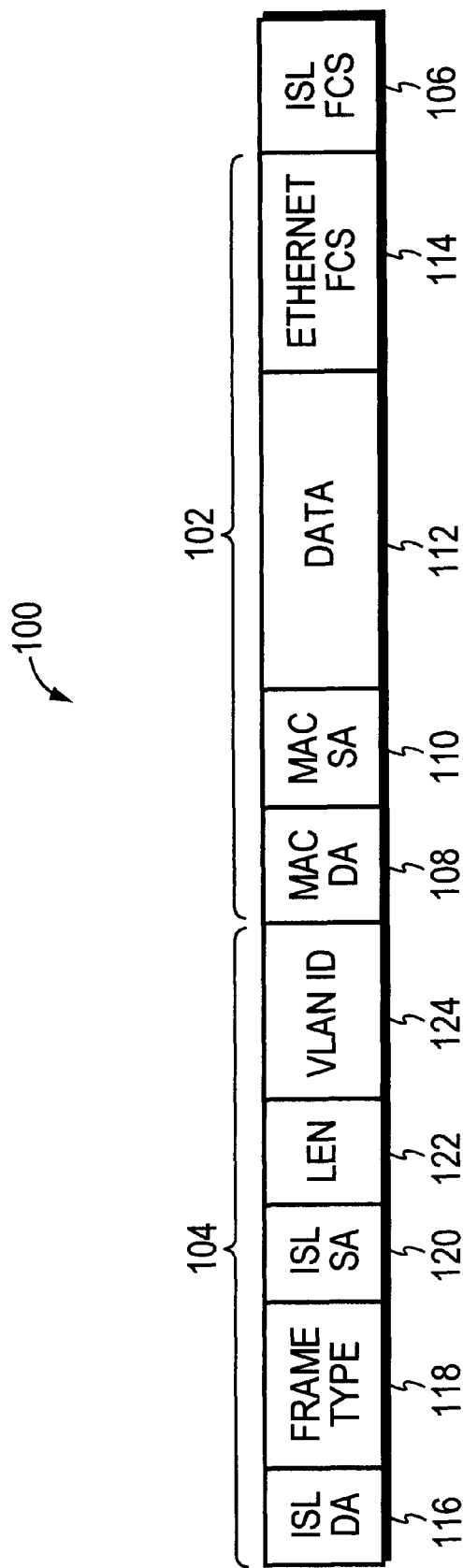
FIG. 1, previously discussed, is a block diagram of an Interswitch Link (ISL) encapsulated Ethernet frame.

The first ISL header 312 includes a plurality of fields and preferably corresponds to the ISL header utilized for Ethernet frames and described above in connection with FIG. 1. In particular, the first ISL header 312 includes an ISL DA field 344, a frame type field 346, an ISL SA field 348, a length (LEN) field 350 and a destination (DEST) VLAN identifier (ID) field 352. The DEST VLAN ID field 352 is used by switches 210, 212 for forwarding purposes. That is, for source routed frames, such as token ring frames, the DEST VLAN ID field 352 is loaded with the VLAN designation associated with the destination CRF entity. This information may be obtained by the switch in a conventional manner by performing, for example, a look-up on a corresponding VLAN database.

Figure 3B:
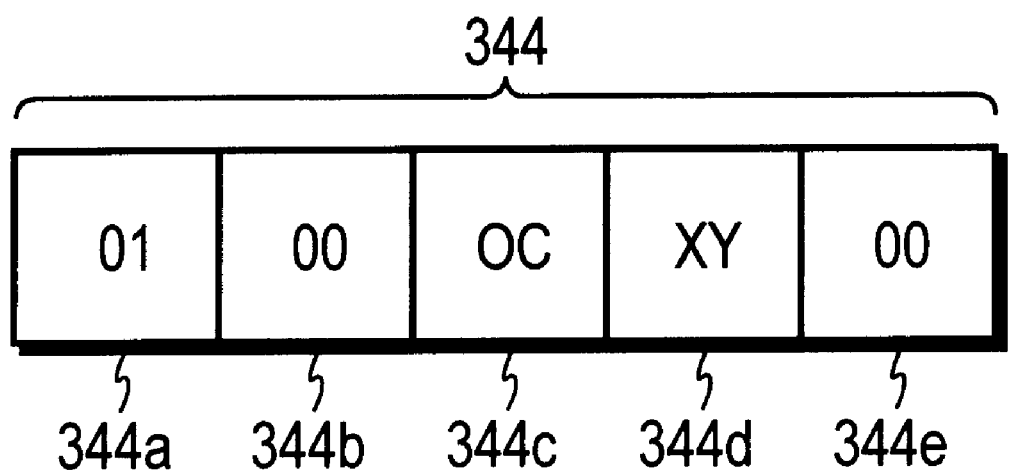
FIG. 3B is a detailed block diagram of a portion of the ISL-encapsulated frame of FIG. 3A.

With reference to FIG. 3B, the ISL DA field 344 is preferably 40 bits long and may be considered to have 5 eight bit (i.e., octet) sections 344a–e. In the preferred embodiment, the ISL DA field 344 is set, prior to transmission on ISL link 220, to the following multicast address: 0x01_00_0C_00_00. As described below, however, the fourth octet 344d of the ISL DA field 344 may be modified while the corresponding ISL-encapsulated frame 310 is being internally processed. More specifically, the fourth octet 344d may be modified by the ISL circuitry to indicate whether error detection should be performed on the frame 310 and, if so, the number of error detection calculations that are to be performed. After the requested error detection calculations are made, the fourth octet 344d is preferably set to "00" prior to transmission of the frame 310.

The second ISL header 314 includes a plurality of fields relating to the token ring frame 316 that is being encapsulated. In particular, the second header 314 includes a source (SRC) VLAN ID field 354, a destination (DEST) route descriptor (RD) field 356, a SRC RD field 358, an FCS not present indicator (F) field 360 and a padding present (P) field 362. The SRC VLAN ID field 354, which may be used by switches 210, 212 for learning purposes, is preferably loaded with the VLAN designation of the CRF entity from which the token ring frame 316 was sourced. The DEST RD field 356 is loaded with the ring number/bridge number pair that follows the matching pair information from the RIF field 334 of token ring frame 316. That is, RIF field 334 typically contains an ordered list of ring number/bridge number pairs through which the frame 316 is to pass as it traverses the corresponding computer network. When the frame 316 is received by a switch, the contents of the RIF field 334 are examined to determine whether the ring number associated with the port on which the frame 316 was received and switch's ID number appear in the RIF field. If so, the switch forwards the frame to the destination port that is coupled to the ring number immediately following its matching switch number in the RIF field 334. Thus, the DEST RD field 356, which is also used for forwarding purposes, is loaded with the routing information from RIF field 334 that follows this matching information (i.e., the remaining portion of the route still to be traveled). Similarly, the SRC RD field 358 contains that portion of RIF field 334 preceding the matching information and is used by switches for source learning.

The F field 360 is a one bit flag indicating whether the original token ring frame 316 being encapsulated has a TR FCS field 338. Preferably, if the F flag is asserted, then the TR FCS field 338 is missing. This may occur, for example, when the RIF field 334 of a received token ring frame 316 is modified upon receipt of the frame 316 at a switch port 228, thereby invalidating the TR FCS field 338. As described below, a new TR FCS value is preferably calculated and loaded into TR FCS field 338 prior to transmission of the encapsulated frame on ISL link 220. The P field 362 indicates whether the ISL-encapsulated frame 310 contains any padding. The P field 362 is preferably not asserted if no padding is present and, if padding is present, it preferably represents the size of the ISL-encapsulated frame 310 before padding was added.

The PAD field 318 simply represents additional bytes added to the ISL-encapsulated frame 310 to ensure that it meets the minimum frame size for transmission across ISL link 220. In particular, the Fast Ethernet standard requires that each frame must be at least 64 bytes long. A frame which is less than 64 bytes long is dropped and not transmitted. Since the first and second ISL headers 312 and 314 and the INT and ISL FCS fields 320 and 322 only add 38 bytes to encapsulated frame 310, the underlying token ring frame 316 must be at least 26 bytes long to meet the minimum frame size for Fast Ethernet. Accordingly, if the token ring frame 316 is less than 26 bytes long, invalid data is preferably inserted at PAD field 318 to bring the ISL-encapsulated token ring frame 310 up to 64 bytes in length.

Figure 4:
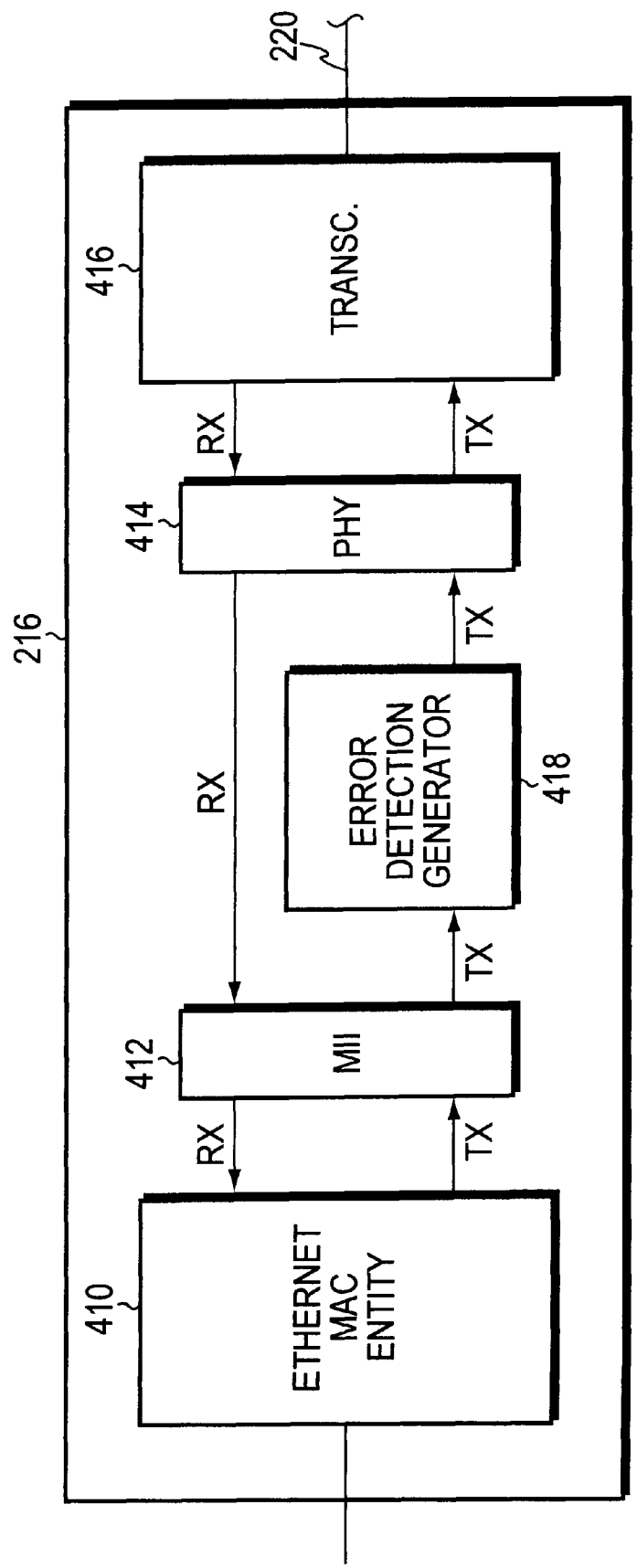
FIG. 4 is a diagram illustrating the relationship between the error detection generator of the present invention and other switch components.

FIG. 4 is a diagram of a portion of the ISL circuitry, such as circuitry 216, illustrating the error detection generator of the present invention in relation to other ISL circuitry components. In particular, the ISL circuitry 216 includes an Ethernet MAC entity 410, which preferably operates in accordance with the Fast Ethernet standard. The Ethernet MAC entity 410 defines a Media Independent Interface (MII) 412, as specified in the Fast Ethernet standard, which may be coupled to a physical (PHY) entity 414. The physical entity 414, in turn, is preferably coupled to a transceiver 416 which drives data across and receives data from the ISL link 220. The physical entity 414 performs the requisite electrical and coding functions specified by the selected physical medium, such as 100Base-FX (Fast Ethernet for Category 5 unshielded twisted pair wiring) or 100Base-FX (Fast Ethernet for Fiber Optic Cabling). The functions, components and interfaces constituting the Ethernet MAC entity 412, the physical entity 414 and the transceiver 416 are well-known to those skilled in the art. See Ethernet-110 Core Technical Manual (copr. 1996) pp. 1-13 to 1-14 and 3-1 to 3-22.

As shown, the ISL circuitry 216 of the present invention preferably includes a novel error detection generator 418 disposed between the MII 412 and the physical entity 414. The error detection generator 418, moreover, is located along the transmit path (TX) from the Ethernet MAC entity 410 to the transceiver 416, but not along the receive (RX) path. That is, data, such as ISL-encapsulated frames 100 and/or 310 to be transmitted, are output by the Ethernet MAC entity 410 at MII 412 and provided to the error detection generator 418. As described below, the error detection generator 418 calculates and inserts the required FCS values into the encapsulated frames 100 and/or 310. Next, the frames 100 and/or 310 are provided to the physical entity 414, processed as necessary and delivered to the transceiver 416 for forwarding across ISL link 220. Data, such as ISL-encapsulated frames 100 and/or 310, that are received at transceiver 416 via ISL link 220 follow a reverse path (RX), except that these received frames preferably do not pass through the error detection generator 418. That is, received frames 100 and/or 310 by-pass the error detection generator 418 and are processed directly by the Ethernet MAC entity 410 via the MII 412.

Figure 5:
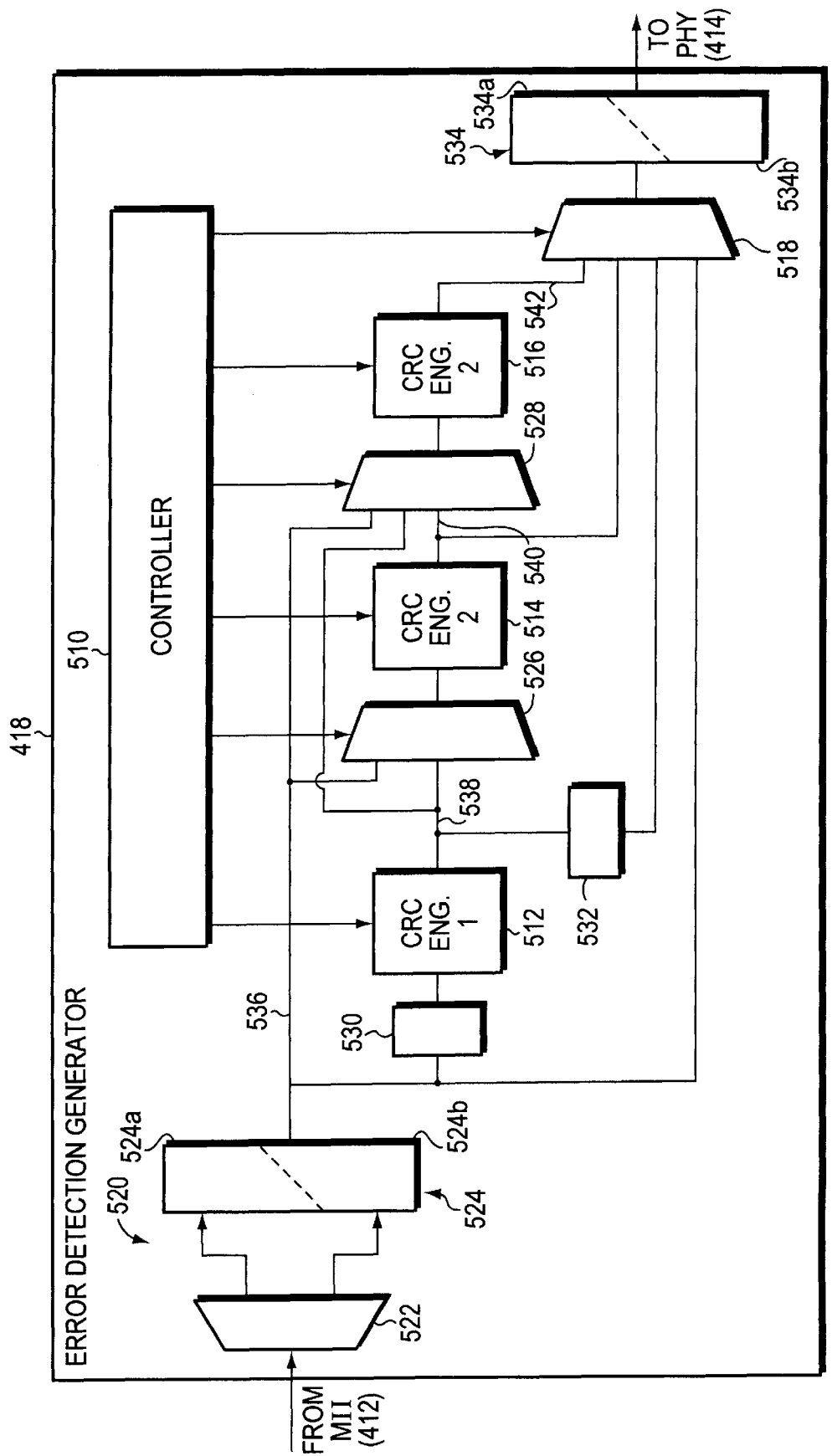
FIG. 5 is a block diagram of the error detection generator of FIG. 4.

FIG. 5 is a highly schematic block diagram of the error detection generator 418. The error detection generator 418 includes a controller 510, at least three cyclic redundancy check (CRC) engines 512, 514 and 516 (which are also identified as CRC Engine 1, CRC Engine 2 and CRC Engine 3), and at least one output multiplexer 518. As explained below, each CRC engine 512–516 is configured to execute an error detection algorithm, such as the frame check sequence (FCS) algorithm, and to output a corresponding FCS value, based on data received by the CRC engine. The CRC engines preferably includes conventional circuitry to execute the frame check sequence (FCS) error detection algorithm and the necessary buffers and transmitting circuitry to output those values as described below.

At the input to the error detection generator 418 is a data adding circuit 520 which receives data in 4 bit increments from the MII 412 and converts it into 8 bit increments for processing by the CRC engines 512–516. In particular, the data adding circuit 520 includes an input multiplexer 522 that is coupled to a buffer memory 524. The buffer memory 524 has two 4 bit registers 524a and 524b and is thus capable of storing two 4 bit data increments. Associated with CRC engines 514 and 516 are separate CRC multiplexers 526 and 528, respectively, while associated with CRC engine 512 are two "flip" circuits 530 and 532, described further herein; one of which (e.g., flip circuit 530) is disposed on the input side of CRC engine 512, while the other (e.g., flip circuit 532) is disposed on the output side. An output buffer memory 534, having two 4 bit registers 534a and 534b, is preferably included at the output of the error detection generator 418. The buffer memory 534 may be coupled to receive data in 8 bit increments from the output multiplexer 518, divide it into 4 bit increments and provide it to the physical entity 414.

A primary data bus 536 connects the data adding circuit 520 to each of the CRC engines 512–516 and to the output multiplexer 518. More specifically, data bus 536 supplies the output of data adding circuit 520 to CRC engine 512 via flip circuit 530, to CRC engine 514 via its associated CRC multiplexer 526 and to CRC engine 516 via its associated CRC multiplexer 528. Thus, data received by error detection generator 418 is provided to each CRC engine 512–516 and the output multiplexer 518 in 8 bit increments. The CRC engines 512–516, moreover, are preferably arranged in a "stream-wise" fashion relative to each other. That is, the output of CRC engine 1 (512) is provided to both the output multiplexer 518 and the two "downstream" CRC engines (514 and 516) via a first CRC engine output bus 538. The output of CRC engine 2 (514) is similarly provided to the one "downstream" CRC engine (516) as well as output multiplexer 518 by a second CRC engine output bus 540. Finally, the output of the last CRC engine (516) is simply provided to the output multiplexer 518 by a third CRC engine output bus 542. In particular, the CRC multiplexer 526 associated with CRC engine 514 has two inputs: the output of the data adding circuit 520 and the output of upstream CRC engine 512. The CRC multiplexer 528 associated with CRC engine 514 has three inputs: the output of the data adding circuit 520, the output of upstream CRC engine 512 and the output of upstream CRC engine 514. Similarly, the output multiplexer has four inputs: the output of the data adding circuit 520 and the output of each CRC engine 512–516.

The controller 510, moreover, is operably coupled to each CRC engine 512–516, the two CRC multiplexers 526, 528 and the output multiplexer 518. The controller 510, moreover, can selectively enable or disable each CRC engine 512–516 independently and adjust each CRC multiplexer 526, 528 to control the input received by the respective CRC engine 514, 516. Similarly, the controller 510 can adjust the output multiplexer 518 to control its output. The controller 510 may operate these components by means of a control bus (not shown).

In operation, an ISL-encapsulated frame, such as encapsulated token ring frame 310, is generated by the ISL circuitry 216, based, for example, on an original token ring frame 316 received at switch 210. Since frame 316 was preferably error checked on receipt, its FCS field was stripped off and is not included within encapsulated frame 310 at this point. Similarly, although the ISL circuitry 216 has encapsulated token ring frame 316, it has not generated the FCS values for fields 320 and 322. Accordingly, the ISL circuitry 216 preferably modifies the contents of the fourth octet 344d of the ISL DA field 344 to indicate that error detection should be performed and that three separate FCS values are to be calculated.

In the preferred embodiment, the ISL circuitry 216 sets the fourth octet 344d to "00" to indicate that no error detection is to be performed, "01", to indicate that error detection is to be performed and two FCS values generated (i.e., the encapsulated frame is an Ethernet frame) or "11" to indicate that error detection is to be performed and three FCS values generated (i.e., the encapsulated frame is a Token Ring frame). In this example, error detection is to be performed and the encapsulated frame 316 requires three FCS values, namely TR FCS, INT FCS and ISL FCS. Accordingly, the ISL circuitry 216 sets the fourth octet 344d to "11".

ISL circuitry 216 also determines whether token ring frame 316 meets the minimum size requirements for the ISL link 220 and, if necessary, inserts padding within PAD field 318. Similarly, the ISL circuitry 216 loads the two ISL headers 312 and 214 with the appropriate information, as described above. The ISL-encapsulated frame 310 is then delivered to the Ethernet MAC entity 410, which, in turn, begins delivering the frame 310 to the error detection generator 418 via MII 412 in 4 bit increments. The 4 bit increments are converted to 8 bit increments by the data adding circuit 520 and placed on primary bus 536.

Figure 6A:
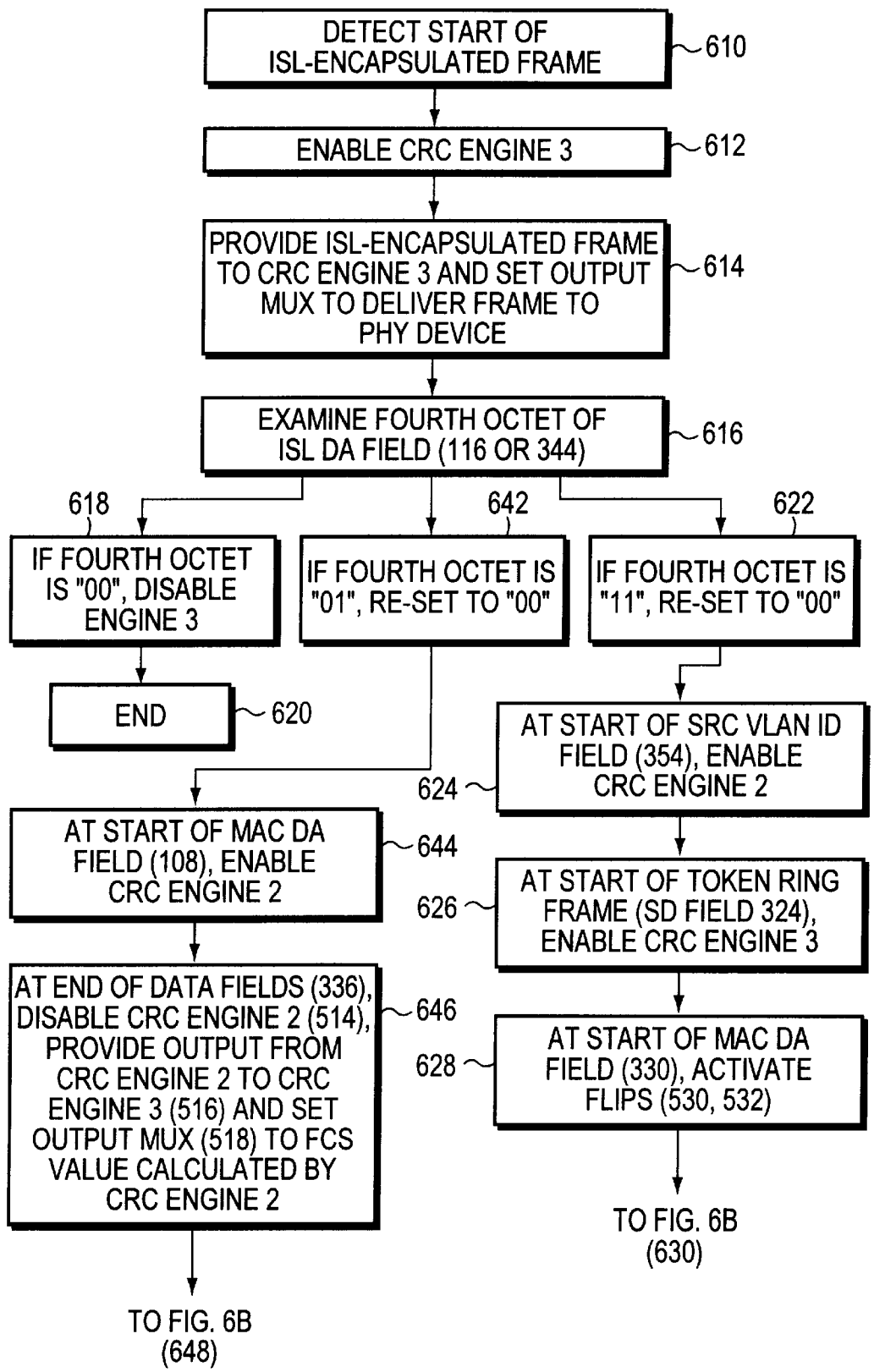
FIGS. 6A and 6B are flow diagrams of the error detection generation methods of the present invention.
Figure 6B:
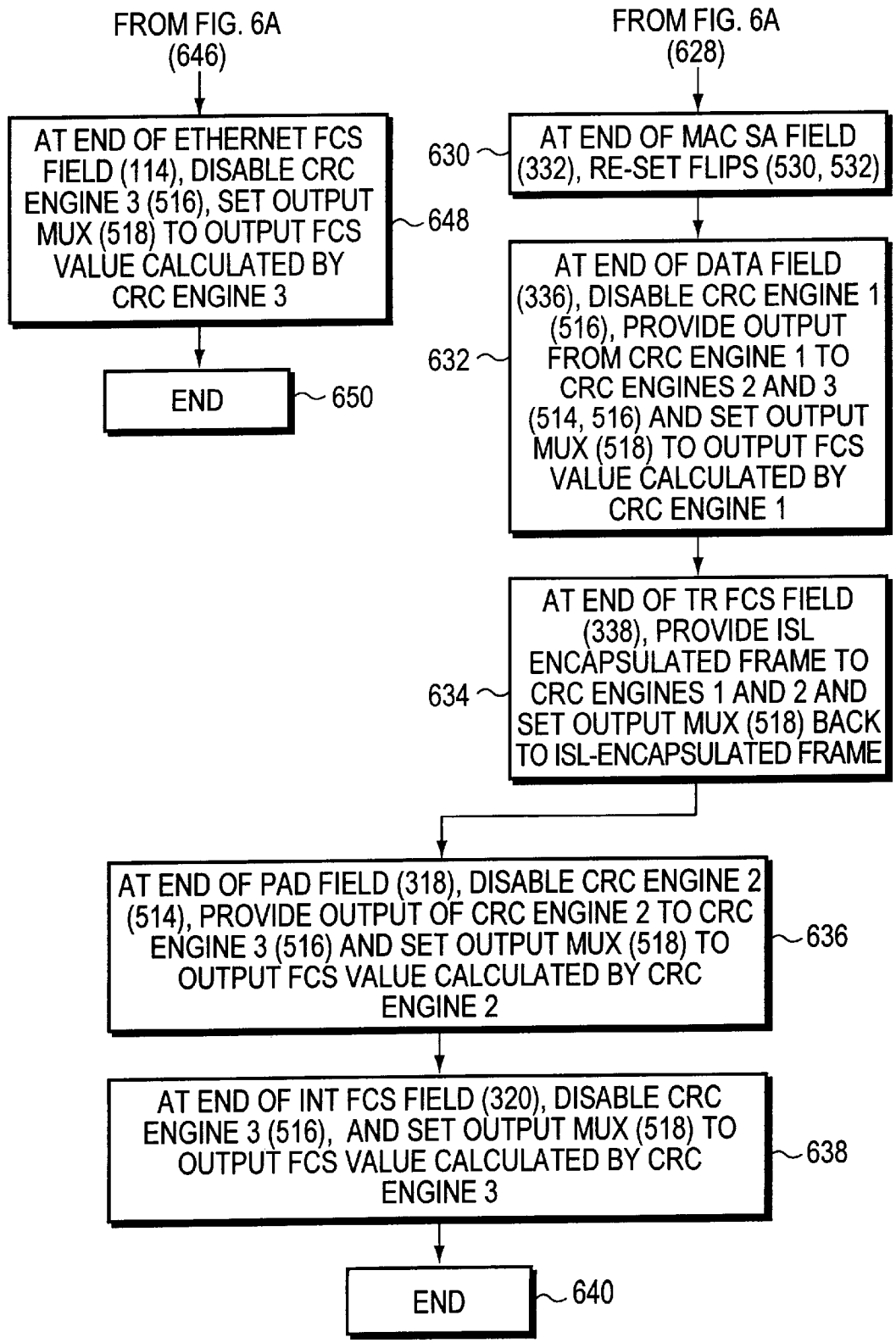

Referring to FIGS. 6A and 6B, which are flow diagrams of the error detection methods of the present invention, controller 510 detects the start of an ISL-encapsulated frames, as indicated at block 610. In response, controller 510 enables CRC engine 516, as indicated at block 612, and sets CRC multiplexer 528 and the output multiplexer 518 so that the encapsulated frame is received by the CRC engine 516 and output to the physical entity 414, as indicated at block 614. In response, CRC engine 516 begins processing the encapsulated frame starting at its first field (i.e., the ISL DA field 116 or 344) in order to generate a frame check sequence (FCS) value. Additionally, the 8 bit increments output from output multiplexer 518 are converted to 4 bit increments by the output buffer memory 534 and forwarded to the physical entity 414 for transmission across ISL link 220.

Next, controller 510 examines the fourth octet 344d of the ISL DA field 344, as indicated at block 616. If the fourth octet is set to "00", then no error detection codes are to be generated and CRC engine 516 is disabled, as shown at block 618, and the process is at an end, as indicated at block 620. In this case, the ISL-encapsulated frame simply travels through the error detection generator 418 unmodified and is forwarded on the ISL link 220.

If the fourth octet is set to "11", then the ISL-encapsulated frame contains a Token Ring frame 316 and three FCS values are to be calculated and inserted by the error detection generator 418. In response, the controller 510 first sets the contents of the fourth octet 344d to "00", as indicated at block 622. Then, at the start of the SRC VLAN ID field 354, the controller 510 enables CRC engine 514 (i.e., CRC engine 2), as indicated at block 624. Thus, CRC engine 514 begins processing the encapsulated frame, starting with the SRC VLAN ID field 354, in order to generate a second FCS value.

It should be understood that controller 510 identifies the boundaries of the various fields of the ISL-encapsulated frames 100, 310 based on its knowledge of the formats of the frames together with the contents of length fields 122, 350 (and the length fields of the underlying Ethernet or Token Ring frames). Controller 510 is thus able to enable and disable the CRC engines at specific fields during the error detection calculation process. It should be further understood that the ISL-encapsulated frames 100, 310, Ethernet frame 102 or Token Ring frame 316 may include additional fields.

At the start of the token ring frame 316 (i.e., at the SD field 324), controller enables CRC engine 512, as shown at block 626, which begins processing the token ring frame 316 portion of the encapsulated frame 310 in order to generate a third FCS value. Even though all three CRC engines 516–518 are enabled at this point, output multiplexer 518 continues to output the encapsulated frame as received on primary bus 536 in 8 bit increments. At the start of the MAC DA field 332, controller 510 preferably activates the two flip circuits 530, 532, as indicated at block 628. The flip circuits 530, 532 accommodate the fact that Token Ring frames, pursuant to the IEEE 802.5 standard, use a most significant bit (MSB) first transmission order for MAC addresses, whereas Ethernet frames, pursuant to the IEEE 802.3 standard, use a least significant bit (LSB) transmission order. By "flipping" (e.g., transposing) the MAC addresses of the Token Ring frame 316, CRC engine 512 can properly generate an FCS value. Accordingly, at the end of the MAC SA field 332, controller 510 preferably resets the flip circuits 530, 532, as shown at block 630.

At the end of the token ring data field 336, controller 510 preferably disables CRC engine 512, causing it to beginning outputting its calculated FCS value on its output bus 538. Controller 510 also sets CRC multiplexers 526, 528 to provide their respective CRC engines 514, 516 with the FCS value from output bus 538. Controller 510 also sets output multiplexer 518 to transmit the FCS value from output bus 538 to the physical device 414, as indicated at block 632. As a result, the four byte FCS value calculated by CRC engine 512 on the basis of frames 324–336 is inserted (in 8 bit increments) into the TR FCS field 338 of the token ring frame 316 (which may have originally been un-asserted or contained an invalid value). This calculated FCS value is also provided to CRC engines 514, 516 so that it may be used in their on-going error detection calculations.

At the end of the TR FCS field 338, controller 510 sets the CRC multiplexers 526, 528 so that their respective CRC engines 514, 516 once again receive the token ring frame 316 (namely, the ED field 340) being driven onto the primary bus 536. The controller 510 also sets the output multiplexer 518 to transmit the token ring frame 316 from bus 536 to the physical entity 414, as indicated at block 634. At the end of the PAD field 318, controller 510 disables CRC engine 514 (i.e., CRC engine number 2), causing it to beginning driving its calculated 4 byte FCS value onto its respective output bus 540 in 8 bit increments. Controller 510 also sets CRC multiplexer 528 to provide CRC engine 516 with the calculated FCS value from output bus 540 and sets output multiplexer 518 to transmit the FCS value calculated by CRC engine 514 to the physical entity 414 in the INT FCS field 320, as indicated at block 636. As a result, the four byte FCS value that was calculated by CRC engine 514 on the basis of fields 354–362 and fields 324–336, is inserted into the INT FCS field 320 of the encapsulated frame 310. This calculated FCS value is also provided to CRC engine 516 so that it may be used in its on-going error detection calculations.

At the end of the INT FCS field 320, controller 510 disables CRC engine 516 causing it to begin outputting its calculated FCS value on output bus 542, as indicated at block 638. Controller 510 also sets the output multiplexer 518 to load the calculated FCS value from bus 542 into the ISL FCS field 322 and transmit it to the physical entity 414 via output buffer memory 534. Once the entire 4 byte FCS value from CRC engine 516 has been loaded into thee ISL FCS field 322, the process is complete as indicated at block 640.

As shown, each CRC engine 512–516 calculates a different FCS value based on different portions of the encapsulated frame 310. In particular, CRC engine 512 calculates an FCS value based on the contents of fields 324–336. CRC engine 514 calculates an FCS value based on the contents of fields 354–362, 324–342 and 318, thereby incorporating the FCS value from CRC engine 512 in its calculations. CRC engine 516 calculates an FCS value based on the contents of fields 344–362 and 316–320, thereby incorporating the FCS values calculated by both CRC engines 512 and 514. Each calculated FCS value, moreover, is inserted into a different field of encapsulated frame 310. In particular, the FCS value from CRC engine 512 is loaded by into the TR FCS field. The FCS value from CRC engine 514 is loaded into the INT FCS field 320 and the FCS value from CRC engine 516 is loaded into the ISL FCS field 322.

Referring again to FIGS. 1 and 6A–6B, if the fourth octet of the ISL DA field 116 of the frame received at the error detection generator 418 is set to "01", then the ISL-encapsulated frame contains an Ethernet type fame 102 and two FCS values are to be calculated. Here, the controller 510 resets the fourth octet 344d to "00", as indicated at block 642. At the start of the MAC DA field 108, controller 510 enables CRC engine 514, as indicated at block 644. At the end of the Ethernet data field 112, the controller 510 disables CRC engine 514, causing it to begin driving its calculated FCS value onto output bus 540, as indicated at block 646. Controller 510 also sets the CRC multiplexer 528 to provide this calculated FCS value to CRC engine 516 for its on-going calculations. Similarly, controller 510 sets output multiplexer 518 to load the Ethernet FCS field 114 with the FCS value calculated by CRC engine 514 and to transmit it to the physical entity 414 via output buffer memory 534.

At the end of the Ethernet FCS field 114, controller 510 disables CRC engine 516, causing it to begin driving its calculated FCS value onto output bus 542, as indicated at block 648. Controller 510 also sets output multiplexer 518 to load the ISL FCS field 106 with the FCS value calculated by CRC engine 516 and to transmit it to the physical entity 414 via output buffer memory 534. Once the entire 4 byte FCS value from CRC engine 516 has been loaded into the ISL FCS field 106 the process is complete as indicated at block 650.

As shown, the error detection generator 418 of the present invention is capable of selectively calculating two or three FCS values and inserting them into the appropriate fields of encapsulated frames, such as ISL-encapsulated token ring frames or ISL-encapsulated Ethernet frames. Additionally, if the received encapsulated frame already has correct FCS values, then the error detection generator 418 can simply pass the frame to the physical entity 414 unmodified. In the preferred embodiment, the error detection generator 418 is implemented in hardware through one or more application specific integrated circuits (ASICs). Nonetheless, it should be understood that the methods pertaining to the present invention may alternatively be implemented through software.

The foregoing description has been directed to specific embodiments of this invention. It will be apparent, however, that other variations and modifications may be made to the described embodiments, with the attainment of some or all of their advantages. For example, the present invention may operate on other types of encapsulated frames, besides Interswitch Link (ISL) encapsulated frames. In addition, other types original frames, such as those relating to token bus, frame relay, Asynchronous Transfer Mode, etc., may be encapsulated and processed by the error detection generator of the present invention. The present invention may also implement other error detection algorithms besides CRC. Therefore, it is the object of the appended claims to cover all such variations and modifications as come within the true spirit and scope of the invention.

What is claimed is:

1. An error detection generator for calculating two or more error detection values or insertion into an encapsulated frame having a plurality of fields, the error detection generator comprising:

a first, a second and a third cyclic redundancy check (CRC) engine each configured to receive the encapsulated frame and having means for calculating an error detection value;

an output multiplexer configured to receive the encapsulated frame and coupled to each of the CRC engines for inserting the calculated error detection values into respective fields of the encapsulated frame; and a controller operably coupled to the CRC engines and the output multiplexer, the controller selectively enabling and disabling the CRC engines to calculate corresponding error detection values based on different fields of the encapsulated frame and setting the output multiplexer to insert the calculated error detection values into the respective fields of the encapsulated frame.

2. The error detection generator of claim 1 wherein the CRC engines are arranged in a first, second and third streamwise fashion so that a first error detection value calculated by the first CRC engine is selectively available to the second and third CRC engines and a second error detection value calculated by the second CRC engine is selectively available to the third CRC engine.

3. The error detection generator of claim 2 wherein the controller selectively provides the second CRC engine with either the encapsulated frame or the first error detection value and selectively provides the third CRC engine with either the encapsulated frame, the first error detection value or the second error detection value.

4. The error detection generator of claim 3 further comprising:

a first CRC multiplexer associated with the second CRC engine; and a second CRC multiplexer associated with the third CRC engine, wherein the controller is configured to set the first CRC multiplexer so as to provide the second CRC engine with either the encapsulated frame or the first error detection value and to set the second CRC multiplexer so as to provide the third CRC engine with either the encapsulated frame, the first error detection value or the second error detection value.

5. The error detection generator of claim 4 wherein the controller is configured to examine the contents of a given field of the encapsulated frame to determine whether error detection values are to be inserted into the respective encapsulated frame.

6. The error detection generator of claim 5 wherein the controller is further configured to determine the number of error detection values to be inserted in an encapsulated frame based on the contents of the given field of the respective encapsulated frame.

7. The error detection generator of claim 6 further comprising first and second flip circuits associated with the first CRC engine, the first flip circuit selectively transposing the bit ordering of a portion of the encapsulated frame received at the first CRC engine and the second flip circuit selectively transposing the bit ordering of the error detection value calculated by the first CRC engine.

8. The error detection generator of claim 7 wherein the controller activates and de-activates the two flip circuits in response to one or more fields of the encapsulated frame.

9. The error detection generator of claim 8 wherein the encapsulated frame includes an Ethernet frame and the error detection generator calculates and inserts two error detection values in the encapsulated frame.

10. The error detection generator of claim 8 wherein the encapsulated frame includes a Token Ring frame and the error detection generator calculates and inserts three error detection values in the encapsulated frame.

11. A network switch comprising:
   Interswitch Link (ISL) circuitry for encapsulating one or more local area network (LAN) frames having a plurality of fields within at least one ISL header; and
   an error detection generator for calculating two or more error detection values for insertion into the ISL-encapsulated frames, the error detection generator comprising:
      three cyclic redundancy check (CRC) engines each configured to receive the ISL-encapsulated frame and having means for calculating an error detection value;
      an output multiplexer configured to receive the ISL-encapsulated frame and coupled to each of the CRC engines for inserting the calculated error detection values into respective fields of the encapsulated frames; and
      a controller operably coupled to the CRC engines and the output multiplexer, the controller selectively enabling and disabling the CRC engines to calculate corresponding error detection values based on different fields of the ISL-encapsulated frames and setting the output multiplexer to insert the calculated error detection values into the respective fields of the ISL-encapsulated frames.

12. A method for calculating and inserting error detection values into encapsulated frames, the method comprising the steps of:
   determining the number of error detection values to be calculated for a given encapsulated frame;
   selectively enabling a first cyclic redundancy check (CRC) engine, in response to the step of determining, to calculate a first error detection value based on the given encapsulated frame;
   enabling a second CRC engine to calculate a second error detection value based on a first portion of the given encapsulated frame;
   enabling a third CRC engine to calculate a third error detection value based on a second portion of the given encapsulated frame; and
   inserting the error detection values calculated by the first, second and third CRC engines into pre-defined fields of the given encapsulated frame.

13. The method of claim 12 further comprising the steps of:
   providing the error detection value calculated by the first CRC engine to the second and third CRC engines for use in their respective error detection calculations; and
   providing the error detection value calculated by the second CRC engine to the third CRC engine for use in its respective error detection calculation.

14. The method of claim 12 wherein, in response to determining that two error detection values are to be calculated for the given encapsulated frame, the first CRC engine is not enabled.

15. An error detection generator for calculating two or more error detection values for insertion into an encapsulated frame having a plurality of fields, the error detection generator comprising:
   a plurality of cyclic redundancy check (CRC) engines each configured to receive the encapsulated frame and having means for calculating an error detection value;
   an output multiplexer configured to receive the encapsulated frame and coupled to each of the CRC engines for inserting the calculated error detection values into respective fields of the encapsulated frame;
   first and second flip circuits associated with a first CRC engine, the first flip circuit selectively transposing the bit ordering of a portion of the encapsulated frame received at the first CRC engine and the second flip circuit selectively transposing the bit ordering of the error detection value calculated by the first CRC engine; and
   a controller operably coupled to the CRC engines, the output multiplexer and the two flip circuits, the controller selectively enabling and disabling the CRC engines to calculate corresponding error detection values based on different fields of the encapsulated frame, activating the two flip circuits, in response to the bit ordering of the encapsulated frame, and setting the output multiplexer to insert the calculated error detection values into the respective fields of the encapsulated frame.

* * * * *